US012787214B2

(12) United States Patent
Li

(10) Patent No.: US 12,787,214 B2
(45) Date of Patent: Nov. 3, 2026

(54) HEAT DISSIPATION STRUCTURE AND UNMANNED AERIAL VEHICLE

(71) Applicant: AUTEL ROBOTICS CO., LTD., Shenzhen (CN)

(72) Inventor: Xiaode Li, Guangdong (CN)

(73) Assignee: AUTEL ROBOTICS CO., LTD., Shenzhen (CN)

( * ) Notice: Subject to any disclaimer, the term of this patent is extended or adjusted under 35 U.S.C. 154(b) by 163 days.

(21) Appl. No.: 18/527,516

(22) Filed: Dec. 4, 2023

(65) Prior Publication Data

US 2024/0196558 A1 Jun. 13, 2024

(30) Foreign Application Priority Data

Dec. 8, 2022 (CN) ......................... 202223299323.4

(51) Int. Cl.
*H05K 7/20* (2006.01)
*B64U 20/98* (2023.01)

(52) U.S. Cl.
CPC ......... *H05K 7/20163* (2013.01); *B64U 20/98* (2023.01); *H05K 7/20336* (2013.01)

(58) Field of Classification Search
CPC ........... H05K 7/20163; H05K 7/20009; H05K 7/20136; H05K 7/20145; H05K 7/20154; B64U 20/98
See application file for complete search history.

(56) References Cited

U.S. PATENT DOCUMENTS 4,952,925 A * 8/1990 Haastert ............ G02F 1/133385 349/82
5,459,923 A * 10/1995 Montesano .......... H05K 3/4061 29/829
6,522,541 B2 * 2/2003 Sakaiya ............. H05K 7/20163 361/689
6,704,199 B2 * 3/2004 Wiley ................ H05K 7/20727 257/722
9,235,232 B2 * 1/2016 King ........................ H05K 5/03
10,624,234 B2 * 4/2020 Saido ................ G02F 1/133385
11,073,877 B2 * 7/2021 Yin .................... H05K 7/20409
2005/0196904 A1 * 9/2005 Bhattacharya ..... H05K 7/20163 257/704
2011/0162831 A1 * 7/2011 Lee .................... H05K 7/20972 165/104.34

(Continued)

*Primary Examiner* — Jayprakash N Gandhi
*Assistant Examiner* — Matthew Sinclair Muir

(57) ABSTRACT

Embodiments of the present disclosure relate to the field of unmanned aerial vehicle technologies, and disclose a heat dissipation structure and an unmanned aerial vehicle including same. The heat dissipation structure includes: a first structure body, where a heat dissipation channel is provided in the first structure body for a cooling medium to flow through; and a second structure body, where the second structure body is arranged in the heat dissipation channel, and configured to divide the heat dissipation channel to form at least two channel branches, where a sealed cavity configured to accommodate a heating device is provided in the second structure body. Through a design of heat dissipation channel branches arranged in a cascading manner, a required sealed space can be formed conveniently between channel branches, providing sufficient sealing to satisfy requirements of components for waterproofing/dustproofing.

19 Claims, 3 Drawing Sheets

(56) References Cited

U.S. PATENT DOCUMENTS

| | | | | |
|---|---|---|---|---|
| 2019/0033932 A1* | 1/2019 | Ku | ........................ | B64D 33/08 |
| 2021/0259131 A1* | 8/2021 | Ide | ............................ | G06F 1/20 |
| 2024/0098940 A1* | 3/2024 | Chung | ................ | H05K 9/0015 |

* cited by examiner

HEAT DISSIPATION STRUCTURE AND UNMANNED AERIAL VEHICLE

CROSS-REFERENCE TO RELATED APPLICATIONS

This application is filed based upon and claims priority to Chinese patent application 202223299323.4, filed on Dec. 8, 2022 and entitled "HEAT DISSIPATION STRUCTURE AND UNMANNED AERIAL VEHICLE" the entire disclosure of which are incorporated herein by reference for all purposes.

BACKGROUND

With continuous progress of the technology, quadcopter unmanned aerial vehicles and other similar unmanned aircrafts have been widely used in people's daily production and life, bringing much convenience to users. To meet the increasingly abundant use demands, unmanned aerial vehicles begin to be equipped with more and more function modules or more powerful components.

These components or function modules are usually arranged or installed in a body of an unmanned aerial vehicle, which requires the unmanned aerial vehicle to have a proper structural design to satisfy heat dissipation requirements of these components. In addition, many components also need to satisfy design requirements such as waterproofing and dustproofing to ensure reliability of operation of the unmanned aerial vehicle.

Therefore, there is an urgent need to provide a proper heat dissipation structure design to take requirements of the unmanned aerial vehicle for both heat dissipation and waterproof and sealing into account.

SUMMARY

The present disclosure relates to the field of unmanned aerial vehicle technologies, and in particular, to a heat dissipation structure and an unmanned aerial vehicle including same.

A heat dissipation structure and an unmanned aerial vehicle provided in the present application can overcome a problem that a traditional heat dissipation structure cannot implement waterproofing and sealing.

According to a first aspect, the present disclosure provides a heat dissipation structure. The heat dissipation structure includes: a first structure body, where a heat dissipation channel is provided in the first structure body for a cooling medium to flow through; and a second structure body, where the second structure body is arranged in the heat dissipation channel, and configured to divide the heat dissipation channel to form at least two channel branches, where a sealed cavity is configured to accommodate a heating device is provided in the second structure body.

According to a second aspect, an embodiment of the present disclosure provides an unmanned aerial vehicle. The unmanned aerial vehicle includes: a body; and the heat dissipation structure according to the above. A first structure body and a second structure body of the heat dissipation structure include internal members of the body.

BRIEF DESCRIPTION OF THE DRAWINGS

One or more embodiments are described by using examples with reference to the corresponding figures in accompanying drawings, and the exemplary descriptions are not to be construed as limiting the embodiments. Elements in the accompanying drawings that have same reference numerals are represented as similar elements, and unless otherwise particularly stated, the figures in the accompanying drawings are not drawn to scale.

DETAILED DESCRIPTION

Figure 1:
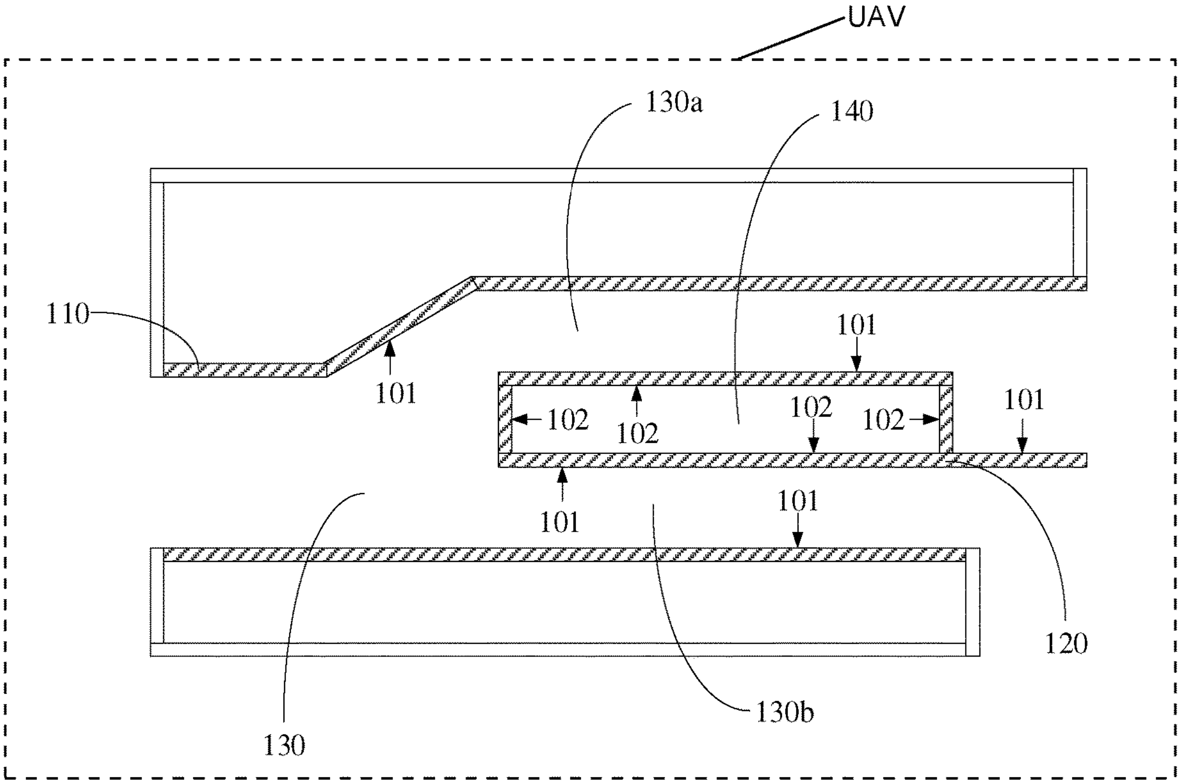
FIG. 1 is a schematic diagram of a heat dissipation structure according to an embodiment of the present disclosure, showing a case that there are two cascading channel branches.

The present disclosure is described below in detail with reference to specific embodiments. It should be emphasized that the following descriptions are merely examples, but are not intended to limit the scope and application of the present disclosure.

It should be noted that unless otherwise specified explicitly, in the descriptions of the specification, orientation or position relationships indicated by terms such as "center", "longitudinal", "transverse", "up", "down", "vertical", "horizontal", "inside" and "outside" are based on orientation or position relationships shown in accompanying drawings, and are used only for ease and brevity of illustration and description of the present disclosure, rather than indicating or implying that the mentioned apparatus or element needs to have a particular orientation or needs to be constructed and operated in a particular orientation. Therefore, such terms should not be construed as limiting of the present disclosure. Terms, such as "mounted", "linked", "connected" and "fixed", should be understood in a broad sense, for example, fixed connection, detachable connection or integral connection, or the connection may be a mechanical connection or an electrical connection; or the connection may be a direct connection or an indirect connection through an intermediary. In addition, the terms "first" and "second" are merely intended for a purpose of description, and shall not be understood as an indication or implication of relative importance or implicit indication of a quantity of indicated technical features. In view of this, a feature defined to be "first" or "second" may explicitly or implicitly include one or more features. "A plurality of" means two or more. "And/or" includes any and all combinations of one or more related listed items. A person of ordinary skill in the art can understand specific meanings of the foregoing terms in the present disclosure according to a specific situation.

As functions of unmanned aerial vehicles continuously improve and performance of the unmanned aerial vehicles becomes increasingly powerful, a number of function modules in the unmanned aerial vehicles also increases. Moreover, more and more function modules begin to be integrated with electronic components such as PCBs, high-power-consumption chips and heat-sensitive devices, which have large heating power consumption and usually need to use an active heat dissipation manner to satisfy their requirements for heat dissipation.

Atypical heat dissipation structure design is to design an air duct for air circulation in the unmanned aerial vehicle. Function modules with high power consumption and high heat dissipation requirements are concentrated on two sides of the air duct, and active heat dissipation is implemented through air circulating in the air duct. Other function modules with low heating power consumption implement heat dissipation in a natural heat dissipation manner.

However, the applicant noticed in the process of implementing the present application that: the foregoing traditional heat dissipation design makes the arrangement positions of the function modules limited by an extension direction of the air duct. When there are a large number of function modules with high power consumption, it is difficult to take all of the function modules into account, and there is a great difficulty in the structural design. Moreover, good sealing protection cannot be provided, which is not conducive to satisfying requirements of specific function modules for waterproofing/dustproofing.

FIG. 1 is a schematic structural diagram of a heat dissipation structure according to an embodiment of the present disclosure. As shown in FIG. 1, the heat dissipation structure may include: a first structure body 110, a second structure body 120, a heat dissipation channel 130 and a sealed cavity 140.

The first structure body 110 and the second structure body 120 are main physical members of the whole heat dissipation structure. The first structure body 110 and the second structure body 120 may be set according to requirements of actual cases to any proper type of size, material or composition manner (for example, including a bracket inside a body of the unmanned aerial vehicle and outer shells of some function modules). For example, the first structure body 110 may be presented as a side wall or a similar plate structure. In this embodiment of the present application, for brevity of description, the first structure body and the second structure body are adopted to represent two types of structure entities with different arrangement positions respectively.

The heat dissipation channel 130 is a channel for a cooling medium to flow through. The heat dissipation channel may be selectively set to a proper channel size and a channel traveling direction according to actual requirements, and is arranged in the first structure body. Specifically, the cooling medium may be flowing air. Alternatively, use of another proper cooling medium may be selected to help improve the heat dissipation effect.

In this embodiment, the second structure body 120 is arranged in the heat dissipation channel 130, dividing the heat dissipation channel into at least two channel branches, for example, two channel branches 130*a* and 130*b* shown in FIG. 1. The channel branch refers to a part forming the heat dissipation channel. The channel branch is formed as spaced and divided by the second structure body 120, and can also allow the cooling medium to flow through, to implement active heat dissipation of function modules around the channel branch. Specifically, a cascading design shown in FIG. 1 may be adopted between a plurality of channel branches. Different channel branches are arranged in a height direction y, so that a specific accommodating space is formed between adjacent channel branches.

The sealed cavity 140 is a space located inside the second structure body 120 and configured to accommodate a heating device. In other words, the sealed cavity 140 may also be considered as a part sandwiched between side walls of two channel branches. Therefore, a person skilled in the art may understand that, the foregoing sealed cavity 140 arranged inside the second structure body may be structurally conveniently designed not to communicate with an external region, to satisfy requirements of the heating device for protection such as waterproofing/dustproofing. In this embodiment, the term, such as “heating device”, may be used to indicate a function module generating a large amount of heat and requiring active heat dissipation.

Specifically, the second structure body 120 may be arranged by adopting any proper type of structure, for example, a packaging structure such as a waterproof rubber ring, so that an internal space remains sealed and does not communicate with a part in the channel branch for the cooling medium to circulate, to form the required sealed cavity 140.

In the heat dissipation structure provided in this embodiment of the present application, a structure design of the plurality of channel branches may have more extension directions, to cover a larger range. In this way, good flexibility can be provided for a position design of a function module. A function module (that is, the heating device) that requires active heat dissipation only needs to be arranged around any channel branch.

In addition, the second structure body may be in a structure that can form a sealed cavity. The heating device is accommodated and placed in the sealed cavity to implement waterproofing in all directions. Therefore, while protection requirements of the heating device are satisfied, the heat dissipation requirements of the heating device may also be taken into account, leading to a good application prospect.

It should be noted that an example in which two channel branches form one sealed cavity is used in this embodiment of the present application. However, a person skilled in the art may understand that, three or more channel branches may alternatively be arranged to form two or more sealed cavities, to accommodate more heating devices.

Figure 2:
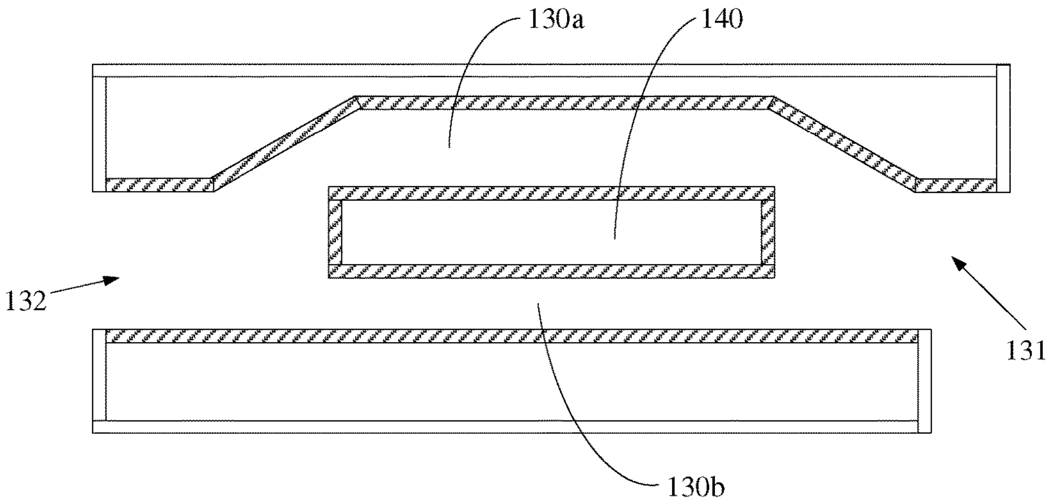
FIG. 2 is a schematic diagram of a heat dissipation structure according to an embodiment of the present disclosure, showing a case that a medium inlet and a medium outlet are shared.

In some embodiments, FIG. 2 is a schematic diagram of a heat dissipation structure according to another embodiment of the present application. As shown in FIG. 2, the heat dissipation channel may be provided with at least one medium inlet 131 and at least one medium outlet 132.

Two or more channel branches are connected to a same medium inlet 131 and/or a same medium outlet 132. In other words, the two or more channel branches may share the same medium inlet 131 and/or the same medium outlet 132.

During practical use, the cooling medium (for example, air) entering from the medium inlet may separately flow to the two channel branches, and leave from the medium outlet after taking away heat of the heating device.

It should be noted that in this embodiment, an example in which the two channel branches share one medium inlet and one medium outlet is used to describe a working principle of heat dissipation of the shared medium inlet/medium outlet. However, a person skilled in the art may understand that, the shared medium inlet or medium outlet may be adjusted or replaced according to a body structure of the unmanned aerial vehicle in which the heat dissipation structure is specifically used. For example, only the medium inlet is shared or only the medium outlet is shared, which is not limited to the illustration in FIG. 2 of the specification.

Figure 3:
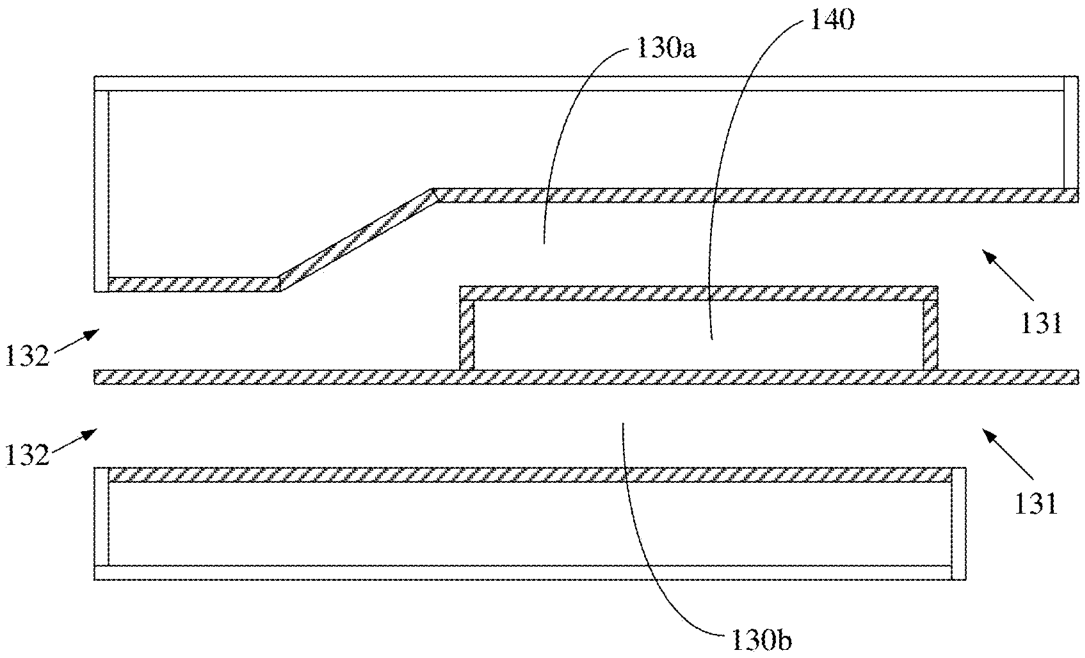
FIG. 3 is a schematic diagram of a heat dissipation structure according to an embodiment of the present disclosure, showing a case that a channel branch is connected to a separate medium inlet and a separate medium outlet.

In some other embodiments, as shown in FIG. 3, the heat dissipation channel may have at least two medium inlets 131 and at least two medium outlets 132.

A number of the medium inlets/medium outlets is set to be same as a number of the channel branches. One medium inlet and/or one medium outlet corresponds to one channel branch. In this embodiment, "correspond to" refers to the medium inlet/medium outlet connected to the channel branch. In other words, the heat dissipation structure in this embodiment differs from the heat dissipation structure shown in FIG. 2 in that each channel branch has its separate medium inlet and separate medium outlet.

During practical use, the cooling medium (for example, air) flowing in from the medium inlet may enter the corresponding channel branch. The cooling medium takes away heat of the heating device arranged around the channel branch and leaves from the corresponding medium outlet.

Figure 4:
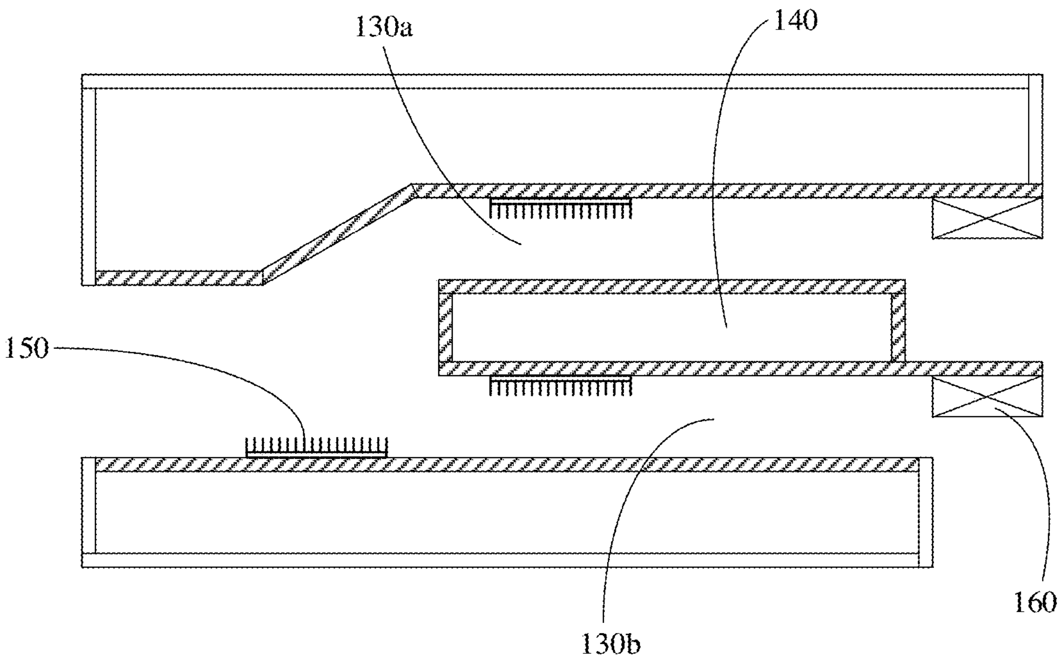
FIG. 4 is a schematic diagram of a heat dissipation structure according to an embodiment of the present disclosure, showing a case that a heat dissipation component is arranged.

In some embodiments, FIG. 4 is a schematic diagram of a heat dissipation structure according to an embodiment of the present application. As shown in FIG. 3, in addition to the heat dissipation channel and the sealed cavity formed by the first structure body and the second structure body, the heat dissipation structure may further include a heat dissipation component 150.

The heat dissipation component 150 is a structural component configured to transfer the heat from the heating device to the heat dissipation channel to help release the heat of the heating device. The heat dissipation component may be arranged in the first structure body and/or the second structure body, and located in a channel branch of any heat dissipation channel, to help improve heat dissipation efficiency of the heat dissipation structure.

Specifically, the heat dissipation component 150 may be selected from: one or more of a heat sink, a heat pipe, a vapor chamber, a graphite sheet and a thermoelectric cooler (Thermo Electric Cooler, TEC), to help improve the heat dissipation efficiency. The heat pipe and the vapor chamber (Vapor Chamber, VC) are phase-change heat transfer components based on high heat-exchange efficiency. A phase-change material is filled in a cavity of the phase-change heat transfer component. The phase-change material in the cavity changes from liquid to gas and absorbs the heat generated by the heating device. When the gas reaches a cooler region, the phase-change material condenses back into liquid and releases heat. The liquid may flow back, through an internal capillary structure, to a region in which the heating device is located.

It should be noted that a specific number, a specific position and an adopted component form of the heat dissipation component 150 may be determined according to requirements of actual cases provided that the heat dissipation requirements can be satisfied and are not limited to the illustration in FIG. 4 of the specification.

In some embodiments, referring to FIG. 4, the heat dissipation structure may further include a medium driving component 160.

The medium driving component 160 is fixed on the first structure body and/or the second structure body and configured to apply a driving force to increase a flow speed of the cooling medium in the heat dissipation channel, thereby improving the heat dissipation efficiency. A proper type of a component may be specifically selected and used as the medium driving component 160 according to requirements of actual cases. A specific arrangement position may be determined according to requirements of actual cases.

For example, when air is used as the cooling medium, the medium driving component may be a fan and arranged at the medium inlet, to drive the air to accelerate and flow through the heat dissipation channel, thereby increasing a heat dissipation speed.

Specifically, the fan may specifically be a turbofan, an axial-flow fan, or other proper types of fans. There may be two or more fans according to requirements of actual cases to match the number of medium inlets.

For example, depending on the arrangement of the medium inlet, when the medium inlet is shared, the medium driving component may be arranged on the first structure body. When a separate medium inlet is adopted, some medium driving components may be arranged on the second structure body (for example, as shown in FIG. 5).

Figure 5:
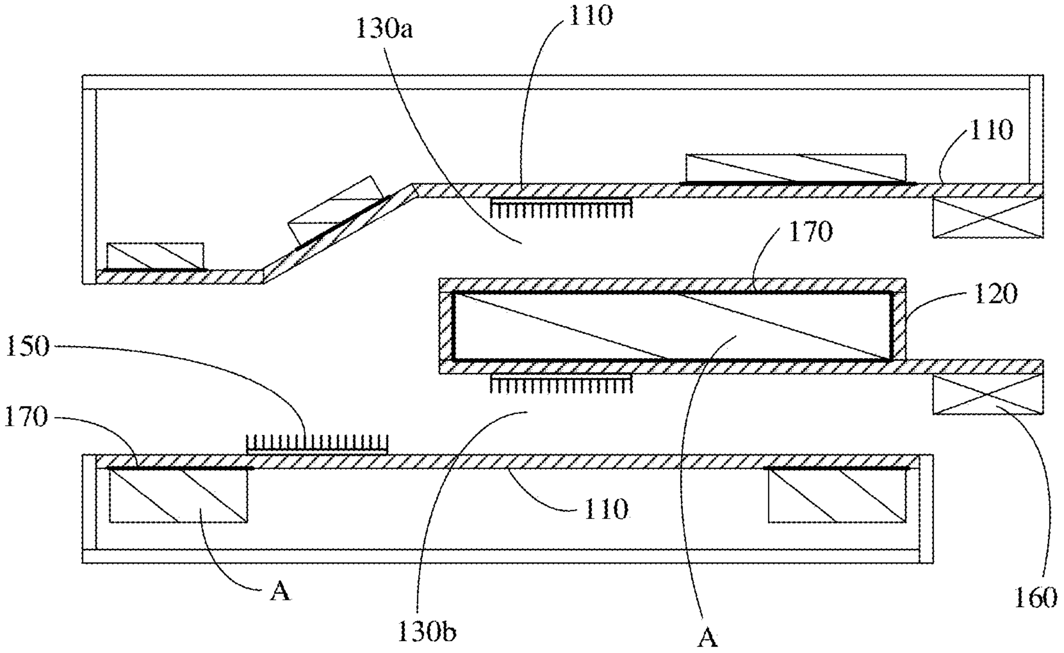
FIG. 5 is a schematic diagram of a heat dissipation structure according to an embodiment of the present disclosure, showing an arrangement position of a heating device.

In some embodiments, FIG. 5 is a schematic diagram of a heat dissipation structure according to another embodiment of the present application. As shown in FIG. 5, in addition to the structure shown in FIG. 4, the heat dissipation structure may further include a heat-conducting layer 170.

The heat-conducting layer 170 is arranged between a heating device A and the first structure body 110 and/or the second structure body 120, to fill a gap between the heating device A and the structure body. In this embodiment, the heat-conducting layer may be made of a thermal interface material with a thermal conductivity coefficient much greater than that of air, including, but not limited to, thermal conductive silicone grease, a thermal conductive pad, a thermal conductive phase-change material, a thermal conductive adhesive (glue), a thermal conductive tape, a thermal conductive gel and the like.

During practical use, the additionally arranged heat-conducting layer may fill a bonding surface between the heating device and the structure body, so that thermal resistance of passing through a thermal interface is reduced, thereby improving the heat dissipation efficiency for the heating device.

In some other embodiments, the first structure body 110 and/or the second structure body 120 forming the heat dissipation channel may be made of a heat conductive metal material, so that heat generated by the heating device can be better transferred to a first wall surface, thereby improving the heat dissipation efficiency.

The heat conductive metal material may be made by selecting and using any proper type of metal material with a high heat conductivity coefficient, such as an aluminum or magnesium alloy, according to requirements of actual cases.

In this embodiment, to distinguish surfaces of different structures easily, a surface facing toward the heat dissipation channel is defined as a first wall surface 101, and a surface facing toward the sealed cavity is referred to as a second wall surface 102. As shown in FIG. 1 of the specification of the present application, the first wall surface 101 includes parts of structural surfaces of the first structure body and the second structure body. The second wall surface 102 includes a structure surface of the second structure body facing away from the first wall surface.

In some embodiments, the heat dissipation channel has at least one medium inlet and at least one medium outlet, where two or more channel branches are connected to a same medium inlet and/or a same medium outlet.

In some embodiments, the heat dissipation channel has at least two medium inlets and at least two medium outlets, where one medium inlet and/or one medium outlet corresponds to one channel branch; and at least two channel branches are connected to corresponding medium inlets and/or corresponding medium outlets respectively.

In some embodiments, the heat dissipation structure further includes: one or more heat dissipation components, the heat dissipation component being arranged on a surface of the first structure body and/or the second structure body facing toward the heat dissipation channel, where the heat dissipation component is configured to transfer heat from the heating device to the heat dissipation channel.

In some embodiments, the heat dissipation component is selected from one or more of the following components: a heat sink; a heat pipe; a vapor chamber; a graphite sheet; and a thermoelectric cooler.

In some embodiments, the heat dissipation structure further includes: a medium driving component, fixed on the first structure body and/or the second structure body, where the medium driving component is configured to apply a driving force to increase a flow speed of the cooling medium.

In some embodiments, the cooling medium is air; and the medium driving component is a fan, where the fan is arranged at the medium inlet, and configured to drive the air to accelerate and flow through the heat dissipation channel.

In some embodiments, the heat dissipation structure further includes: a heat-conducting layer, arranged between the heating device and the second structure body, where the heat-conducting layer is made of a thermal interface material, and configured to fill a gap between the heating device and the second structure body.

In some embodiments, the first structure body and/or the second structure body are made of a heat conductive metal material, enabling heat located on a side of a second wall surface to be transferred to a first wall surface, where the first wall surface is a surface facing toward the heat dissipation channel; and the second wall surface is a surface facing toward the sealed cavity.

During practical use, heat dissipated by a plurality of heating devices arranged closely to the first structure body and/or the second structure body may be conducted to the heat dissipation channel by the heat dissipation component. After heat exchange with cool air or a similar cooling medium, the heat is taken away by the cooling medium. In addition, the heat dissipated by the heating device may also be conducted to the first wall surface sequentially through the heat-conducting layer and the first structure body and/or the second structure body made of the heat conductive metal, for exchange heat with the cooling medium.

Based on the heat dissipation structure provided in the embodiments of the present application, an embodiment of the present application further provides an unmanned aerial vehicle. The heat dissipation structure described in the foregoing one or more embodiments is arranged on a body of the unmanned aerial vehicle, to satisfy requirements of the internal function modules of the unmanned aerial vehicle for heat dissipation, waterproofing and sealing and ensure reliable and continuous operation of the unmanned aerial vehicle.

For a structure body of the heat dissipation structure, two or more layers of channel branches may be constructed and formed from an internal structural member of the body of the unmanned aerial vehicle, to further form one or more sealed cavities. The heating device of the unmanned aerial vehicle, such as a power management chip, may be covered and accommodated in the sealed cavity, to satisfy requirements of the heating device for heat dissipation and waterproofing and sealing.

In conclusion, the heat dissipation structure and the unmanned aerial vehicle including the same provided in the embodiments of the present application can ensure good sealing of the heating device accommodated in the sealed cavity while providing good active heat dissipation efficiency, thereby satisfying waterproofing/dustproofing requirements in all directions.

In addition, the heat dissipation structure provided in the embodiments of the present application features easy expansion and strong adaptability. The heat dissipation structure may be expanded to having more channel branches conveniently to form more sealed cavities, thereby accommodating or holding more heating devices. In addition, constraints on a layout design of the heating device of the unmanned aerial vehicle may also be reduced, so that the heating device can obtain a more proper layout or arrangement in the body of the unmanned aerial vehicle.

At least one advantageous aspect of the heat dissipation structure and the unmanned aerial vehicle provided in the embodiments of the present disclosure is as follows: Through a design of heat dissipation channel branches arranged in a cascading manner, a required sealed space can be formed conveniently between the channel branches, providing sufficient sealing to satisfy requirements of components for waterproofing/dustproofing. In addition, the design of a plurality of channel branches can provide enough flexibility to meet requirements of function modules at different deployment positions for active heat dissipation.

The foregoing contents are detailed descriptions of the present disclosure with reference to specific/exemplary embodiments. It should not be considered that the specific implementation of the present disclosure is limited to these descriptions. For a person of ordinary skill in the art, several transformations and improvements can be made without departing from the creative idea of the present disclosure. These transformations and improvements belong to the protection scope of the present disclosure.

What is claimed is:

1. A heat dissipation structure for an unmanned aerial vehicle (UAV), comprising:

a first structure body of the UAV, wherein a heat dissipation channel is provided in the first structure body for a cooling medium to flow through;

at least one heat dissipation component, the heat dissipation component being arranged on a surface of the first structure body facing toward the heat dissipation channel, wherein the cooling medium is restricted to being on a side of the heat dissipation component facing toward the heat dissipation channel; and a second structure body of the UAV, wherein the second structure body is arranged in the heat dissipation channel, and configured to divide the heat dissipation channel to form at least two channel branches, a sealed cavity configured to accommodate a heating device is provided in the second structure body of the UAV.

2. The heat dissipation structure according to claim 1, wherein the heat dissipation channel has at least one medium inlet and at least one medium outlet, wherein the at least two channel branches are connected to a same medium inlet;

the at least two channel branches are connected to a same medium outlet.

3. The heat dissipation structure according to claim 1, wherein the heat dissipation channel has at least two medium inlets and at least two medium outlets, the first medium inlets and the first medium outlets corresponds to a first channel branch;

the second medium inlets and the second medium outlets corresponds to a second channel branch.

4. The heat dissipation structure according to claim 1, wherein the heat dissipation component is configured to transfer heat from the heating device to the heat dissipation channel.

5. The heat dissipation structure according to claim 1, further comprising:

at least one heat dissipation component, the heat dissipation component being arranged on a surface of the second structure body facing toward the heat dissipation channel, wherein the heat dissipation component is configured to transfer heat from the heating device to the heat dissipation channel.

6. The heat dissipation structure according to claim 4, wherein the heat dissipation component is a thermoelectric cooler.

7. The heat dissipation structure according to claim 4, wherein the heat dissipation component is a heat sink.

8. The heat dissipation structure according to claim 4, wherein the heat dissipation component is a graphite sheet.

9. The heat dissipation structure according to claim 4, wherein the heat dissipation component is a vapor chamber.

10. The heat dissipation structure according to claim 1, further comprising:

a medium driving component, fixed on the first structure body wherein the medium driving component is configured to apply a driving force to increase a flow speed of the cooling medium.

11. The heat dissipation structure according to claim 1, further comprising:

a medium driving component, fixed on the second structure body, wherein the medium driving component is configured to apply a driving force to increase a flow speed of the cooling medium.

12. The heat dissipation structure according to claim 10, wherein the cooling medium is air; and the medium driving component is a fan, wherein the fan is arranged at a medium inlet, and configured to drive the air to accelerate and flow through the heat dissipation channel.

13. The heat dissipation structure according to claim 1, wherein the two channel branches is cascaded, and arranged along a height direction y.

14. The heat dissipation structure according to claim 1, further comprising:

a heat-conducting layer, arranged between the heating device and the second structure body, wherein the heat-conducting layer is made of a thermal interface material, and configured to fill a gap between the heating device and the second structure body.

15. The heat dissipation structure according to claim 14, wherein the second structure body is made of a heat conductive metal material, enabling heat located on a side of a second wall surface to be transferred to a first wall surface, wherein the first wall surface is a surface facing toward the heat dissipation channel; and the second wall surface is a surface facing toward the sealed cavity.

16. An unmanned aerial vehicle (UAV), comprising:

a body of the UAV;

a heat dissipation structure; and a first structure body of the UAV and a second structure body of the UAV of the heat dissipation structure comprise internal members of the body;

wherein the heat dissipation structure comprises:

the first structure body of the UAV, wherein a heat dissipation channel is provided in the first structure body for a cooling medium to flow through; at least one heat dissipation component, the heat dissipation component being arranged on a surface of the first structure body facing toward the heat dissipation channel, wherein the cooling medium is restricted to a side of the heat dissipation component facing toward the heat dissipation channel; and the second structure body of the UAV, wherein the second structure body is arranged in the heat dissipation channel, and configured to divide the heat dissipation channel to form at least two channel branches, a sealed cavity configured to accommodate a heating device is provided in the second structure body of the UAV.

17. The unmanned aerial vehicle according to claim 16, wherein the heat dissipation channel has at least one medium inlet and at least one medium outlet;

the at least two channel branches are connected to a same medium inlet;

the at least two channel branches are connected to a same medium outlet.

18. The unmanned aerial vehicle according to claim 16, wherein the heat dissipation channel has at least two medium inlets and at least two medium outlets, the first medium inlets and the first medium outlets corresponds to a first channel branch;

the second medium inlets and the second medium outlets corresponds to a second channel branch.

19. The unmanned aerial vehicle according to claim 16, wherein the two channel branches is cascaded, and arranged along a height direction y.

* * * * *